(12) United States Patent  
Sano (10) Patent No.: US 7,453,079 B2
(45) Date of Patent: Nov. 18, 2008

(54) SURFACE MOUNT TYPE PHOTO-INTERRUPTER AND METHOD FOR MANUFACTURING THE SAME

(75) Inventor: Masashi Sano, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/485,768

(22) Filed: Jul. 13, 2006

(65) Prior Publication Data

US 2007/0018123 A1    Jan. 25, 2007

(30) Foreign Application Priority Data

Jul. 21, 2005    (JP) .............................. 2005-211136

(51) Int. Cl.
G02B 27/00    (2006.01)
(52) U.S. Cl. ........................................ 250/551; 257/82
(58) Field of Classification Search ................ 250/551; 257/99, 676, 82
See application file for complete search history.

(56) References Cited

U.S. PATENT DOCUMENTS 4,933,729 A * 6/1990 Soejima et al. ............... 257/82
5,214,495 A * 5/1993 Kitanishi ...................... 257/80
5,291,038 A * 3/1994 Hanamoto et al. ............ 257/82
5,436,472 A * 7/1995 Ogawa ......................... 257/82
5,783,836 A * 7/1998 Liu et al. ...................... 250/574
2002/0088981 A1 * 7/2002 Suzuki ......................... 257/79
2005/0029435 A1 * 2/2005 Ogawa ..................... 250/214 R
2005/0056796 A1 * 3/2005 Takeuchi ..................... 250/551

FOREIGN PATENT DOCUMENTS

JP            6-350129          12/1994

* cited by examiner

*Primary Examiner*—Georgia Y Epps
*Assistant Examiner*—Kevin Wyatt
(74) *Attorney, Agent, or Firm*—Hamre, Schumann, Mueller & Larson, P.C.

(57) ABSTRACT

A surface mount type photo-interrupter includes an insulating base, a light emitting element and a light receiving element provided on the insulating base, a first terminal electrode for the light emitting element, a second terminal electrode for the light receiving element, a first primary mold which is transparent and covers the light emitting element, a second primary mold which is transparent and covers the light receiving element, and a secondary mold which is opaque and fixes the first and second primary molds. Each of the first and second terminal electrodes is formed at a side surface and/or a lower surface of the insulating base. The secondary mold is provided with a groove located between the first and second primary molds. Light from the light emitting element passes across the groove to reach the light receiving element.

7 Claims, 11 Drawing Sheets

SURFACE MOUNT TYPE PHOTO-INTERRUPTER AND METHOD FOR MANUFACTURING THE SAME

BACKGROUND OF THE INVENTION

1. Field of the Invention

The present invention relates to a surface mount type photo-interrupter and a method of manufacturing the same.

2. Description of the Related Art

JP-A-H6-350129 Gazette discloses an example of a conventional photo-interrupter of surface mount type. The photo-interrupter includes a light emitting element and a light receiving element provided in a resin package, and metal leads extending from respective elements mentioned above. A groove is provided between the light emitting element and the light receiving element. The photo-interrupter detects an object passing through this groove.

In manufacturing the above-mentioned conventional photo-interrupter, each of the elements is sealed together with leads by transparent resin so as to form a primary mold. Then, the paired primary molds are fixed integrally by opaque resin so as to form a secondary mold.

Due to the metal leads consisting of a metal plate, however, the photo-interrupter shows relatively large weight and requires high manufacturing cost. In addition, since the leads project out of the resin package, not only the resin package but also the leads require space when the photo-interrupter is mounted onto the circuit board. This causes growth in size of a device employing the photo-interrupter.

SUMMARY OF THE INVENTION

It is an object of the present invention to provide a surface mount type photo-interrupter which shows small weight, compact size, and low manufacturing cost.

According to the first aspect of the present invention, there may be provided a surface mount type photo-interrupter. This photo-interrupter may comprise a rectangular insulating base, a light emitting element and a light receiving element both provided at the upper surface of the insulating base. The photo-interrupter may also comprise a first electrode for the light emitting element, a second terminal electrode for the light receiving element, a first primary mold made of transparent synthetic resin and covering the light emitting element, a second primary mold made of transparent synthetic resin and covering the light receiving element, a secondary mold made of opaque synthetic resin and fixing the first primary mold and the second primary mold. Each of the first and second terminal electrodes may be formed at one or both of the side surface and the lower surface of the insulating base. The secondary mold may be provided with a groove located between the first and second primary molds. Light generated by the light emitting element passes across the groove and then reaches the light receiving element.

With such a configuration, the photo-interrupter does not include a lead made of metal plate. Thus, the photo-interrupter has a small weight, and the cost of manufacturing it is advantageously low. Further, the photo-interrupter requires a small space for soldering.

Preferably, the secondary mold may be provided with a pair of inner surfaces facing the groove, and each of the inner surfaces provided with a light transmission hole through which the light emitted from the light emitting element passes. The first primary mold may be provided with a first reflecting surface to direct light from the light emitting element toward the transmission holes, while the second primary mold provided with a second reflecting surface to direct light from the transparent holes toward the light receiving element.

With such a configuration, the reflecting surfaces provided at primary molds guide light generated by the light emitting element to the light receiving element accurately.

Preferably, the secondary mold may include a light shielding portion located between the first primary mold and the second primary mold.

With such a configuration, light generated by the light emitting element is prevented from reaching the light receiving element directly without passing through the groove, whereby accuracy of detection is improved.

Preferably, the insulating base may consist of a plurality of stacked, insulating substrates.

With such a configuration, deformation of the insulating base due to external force or difference of thermal expansion is prevented, whereby accuracy of detection is improved.

According to the second aspect of the present invention, there may be provided a method of manufacturing a surface mount type photo-interrupter, the method comprising the steps of: providing an upper surface of an insulating base with a light emitting element and a light receiving element; forming a first terminal electrode for the light emitting element and a second terminal electrode for the light receiving element on at least one of a side surface and a lower surface of the insulating base; forming a first primary mold made of transparent synthetic resin and covering the light emitting element through pressing a primary mold forming die onto an upper surface of the insulating base; forming a second primary mold made of transparent synthetic resin and covering the light receiving element through pressing a primary mold forming die onto the upper surface of the insulating base; forming a secondary mold made of opaque synthetic resin and fixing the first and second primary molds integrally through pressing a secondary mold forming die onto the upper surface of the insulating base, wherein, in the step of forming a secondary mold, a core forms a groove, which allows an object to be detected to pass through and also allows light from the light emitting element to the light receiving element to propagate across, at a portion of the secondary mold which is located between the first and second primary mold as well as a transmission hole, which allows the light pass through, at the secondary mold.

With such a method, molding is performed through pressing a single primary or secondary die onto a substrate. The related art described above requires two dies to sandwich leads from opposite directions in the step of forming a primary mold. This causes molding dies to have complicated shapes and one molding step to need longer time to perform. In the present invention, a desired mold is obtained only through pressing one die onto the insulating base, whereby the manufacturing cost is eliminated.

Preferably, when the secondary mold forming die is pressed onto the insulating base, the secondary mold forming die may make contact with an inclined surface for reflection provided at the first primary mold and another inclined surface for reflection provided at the second primary mold so as to press the both of the first and second primary molds onto the core.

Preferably, the first and second primary molds may be formed at the same time using only one die.

According to the third aspect of the present invention, there may be provided a method of manufacturing a surface mount type photo-interrupter, the method comprising the steps of: producing a material substrate including a plurality of regions corresponding to a plurality of insulating substrates; providing an upper surface of the material substrate with light emitting elements and light receiving elements corresponding to the respective regions; forming on the material substrate first terminal electrodes corresponding to the respective light emitting elements at the respective regions and second terminal electrodes corresponding to the respective light receiving elements at the respective regions; forming first primary molds made of transparent synthetic resin and covering the respective light emitting elements at the respective regions through pressing a primary mold forming die onto an upper surface of the material substrate; forming second primary molds made of transparent synthetic resin and covering the respective light receiving elements at the respective regions through pressing a primary mold forming die onto the upper surface of the material substrate; forming secondary molds made of opaque synthetic resin and fixing the respective first and second primary molds integrally in the respective regions through pressing a secondary mold forming die onto the upper surface of the material substrate; cutting the material substrate to isolate each of the regions individually, wherein, in the step of forming secondary molds, cores form grooves, each of which allows an object to be detected to pass through and also allows light from the corresponding light emitting element to the corresponding light receiving element to propagate across, at portions of the secondary molds each of which is located between the corresponding first and second primary mold as well as transmission holes, each of which allows the light pass through, at the respective secondary molds.

Preferably, when the secondary mold forming die is pressed onto the material substrate, the secondary mold forming die may make contact with inclined surfaces for reflection provided at the respective first primary molds and inclined surfaces for reflection provided at the respective second primary molds at the respective regions so as to press the both of the first and second primary molds onto the respective cores.

Preferably, the first and second primary molds may be formed at the same time using only one die.

Other features and advantages of the present invention will become apparent from the detailed description given below with reference to the accompanying drawings.

DETAILED DESCRIPTION OF THE PREFERRED EMBODIMENT

Preferred embodiments of the present invention will be described below with reference to the accompanying drawings.

Firstly, explanation will be given about the structure of a photo-interrupter according to the present invention with reference to FIGS. 1-8.

Figure 1:
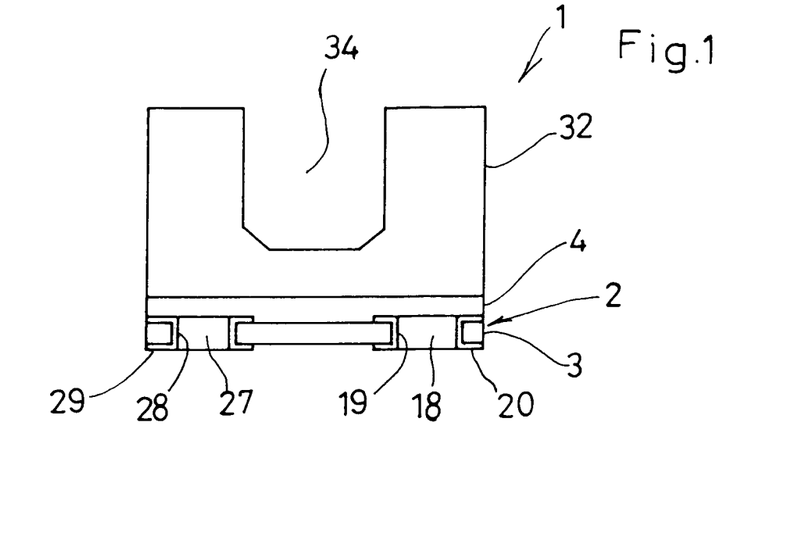
FIG. 1 is a front view showing an example of a surface mount type photo-interrupter according to the present invention.
Figure 2:
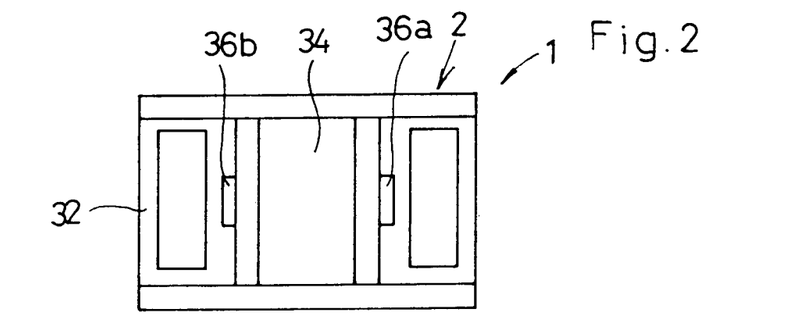
FIG. 2 is a plan view of the photo-interrupter.
Figure 3:
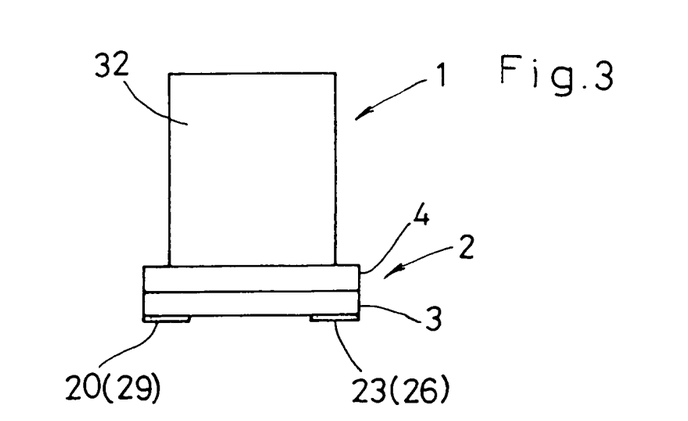
FIG. 3 is a side view of the photo-interrupter.

As shown in FIGS. 1-3, a surface mount type photo-interrupter 1 includes a chip type insulating base 2 which consists of a main insulating substrate 3 and a sub insulating substrate 4. The main insulating substrate 3 is made of an opaque insulating material such as glass epoxy. The sub insulating substrate 4, which is overlaid on the main insulating substrate 3, is made of the same opaque insulating material as the main insulating substrate 3. Such a multi-layer structure prevents deformation of the insulating base 2 due to external forces more effectively than the case that the insulating base 2 has a single-layer structure. In addition, since the main insulating substrate 3 and the sub insulating substrate 4 are made of the same material, the insulating base 2 is not deformed due to difference of thermal expansion.

Figure 5:
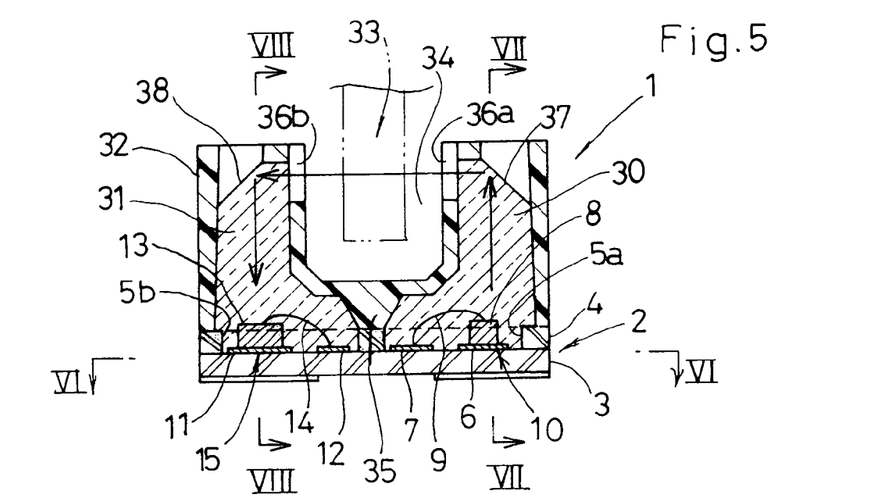
FIG. 5 is a sectional view of the photo-interrupter.
Figure 6:
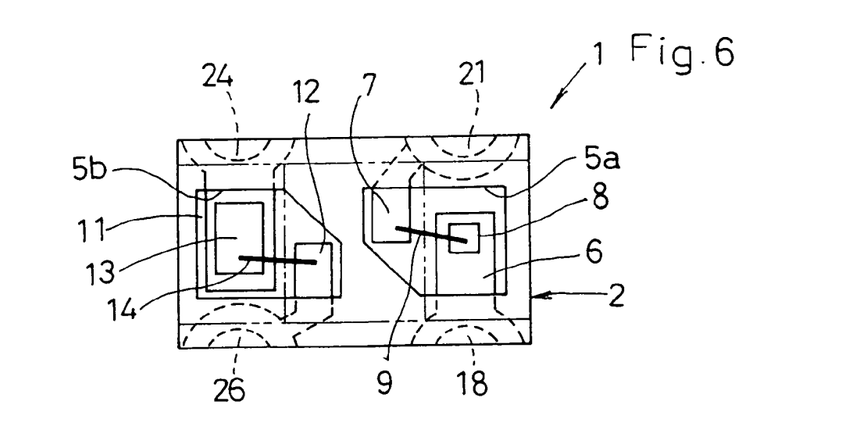
FIG. 6 is a sectional view along a line VI-VI in FIG. 5.

As shown in FIG. 5 and FIG. 6, the sub insulating substrate 4 is provided with a pair of through-hole 5a and 5b. One through-hole houses a light emitting element 10. The light emitting element 10 includes a pair of electrode patterns 6, 7 formed on the upper surface of the main insulating substrate 3, a light emitting diode chip 8 attached on one electrode pattern 6 through die bonding, and a metal wire 9 for wire bonding to connect the light emitting diode chip 8 and the other electrode pattern 7.

The other through-hole 5b houses a light receiving element 15. The light receiving element 15 includes a pair of electrode patterns 11, 12 formed on the upper surface of the main insulating substrate 3, a light sensitive chip 13 attached on one electrode pattern 11 through die bonding, and a metal wire 14 for wire bonding to connect the light sensitive chip 13 and the other electrode pattern 12.

Figure 4:
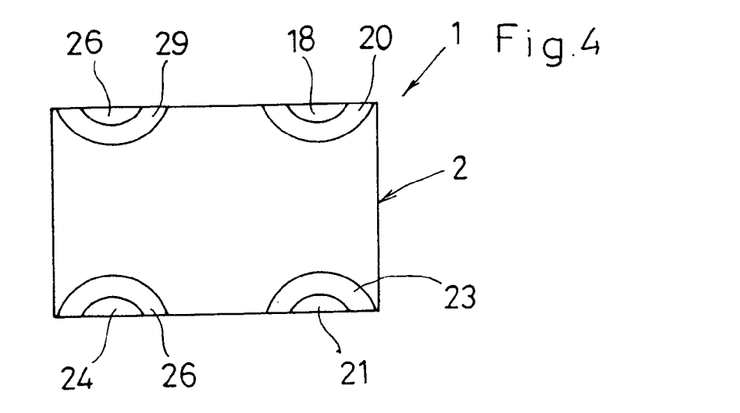
FIG. 4 is a bottom view of the photo-interrupter.
Figure 7:
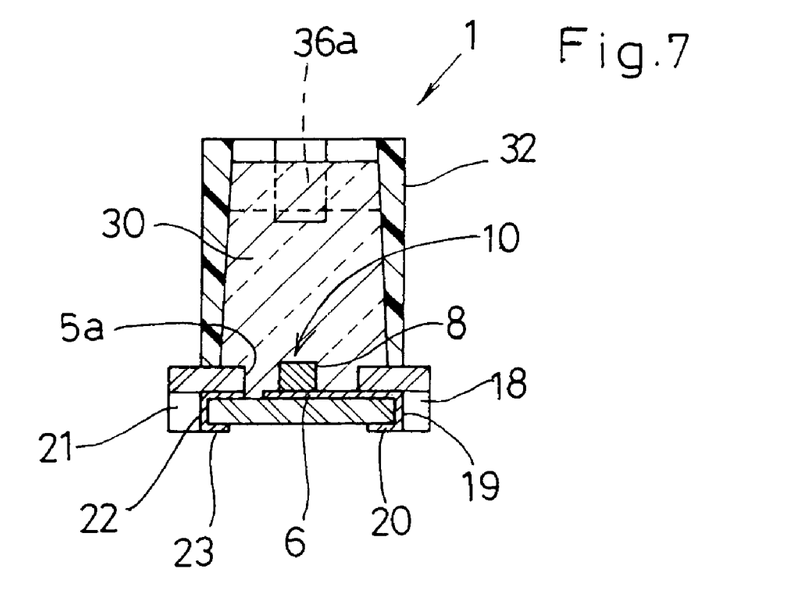
FIG. 7 is a sectional view along a line VII-VII in FIG. 5.
Figure 8:
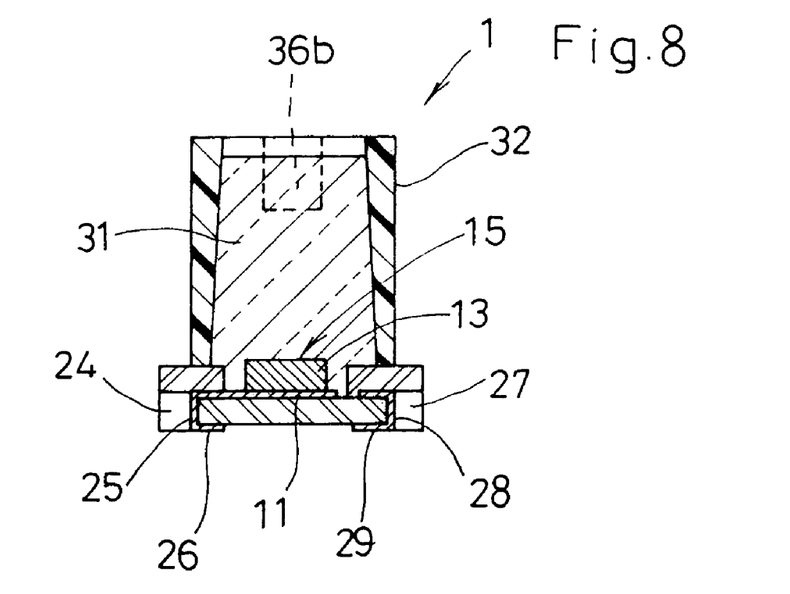
FIG. 8 is a sectional view along a line VIII-VIII in FIG. 5.

As shown in FIG. 4, recesses 18, 21, 24, 27 is formed at the side surfaces (i.e. two surfaces extending laterally in the figure) of the main insulating substrate 3. Four terminal electrodes 20, 23, 26, 29, which are adjacent to the recesses, are formed on the lower surface of the main insulating substrate 3. As shown in FIG. 7 and FIG. 8, the recesses 18, 21, 24, 27 are provided with side electrodes 19, 22, 25, 28, respectively. The side electrodes 19, 22, 25, 28 connect the electrode patterns 6, 7, 11, 12 and the terminal electrodes 20, 23, 26, 29, respectively. For mounting the surface mount type photo-interrupter 1 onto a printed circuit board or the like, the terminal electrodes 20, 23, 26, 29 and the side electrodes 6, 7, 11, 12 are utilized for soldering.

As shown in FIG. 5, two primary molds 30, 31 are formed on the insulating base 2. One primary mold 30 seals the light emitting element 15 while the other primary mold 31 seals the light receiving element 15. Both of the primary molds are fixed integrally by a secondary mold 32. Each of the primary molds 30, 31 is made of transparent resin such as epoxy resin. The secondary mold 32 is made of opaque synthetic resin.

The primary molds 30, 31 are provided with inclined surfaces 37, 38, respectively. These inclined surfaces serve to reflect light generated by the light emitting element 10 so as to guide the light to the light receiving element 15.

The secondary mold 32 includes a light shielding portion 35 which isolates the two primary molds 30, 31 from each other. The light shielding portion 35 makes contact with part of the sub insulating substrate 4. The part separates the two through-hole 5a, 5b. Such arrangement prevents light generated by the light emitting element 10 from reaching the light receiving element 15 directly (i.e. not along the proper path described with three arrows in FIG. 5).

As shown in FIG. 2 and FIG. 5, the secondary mold 32 is formed with a groove 34 which allows an object 33 to pass through for detection and with a pair of transmission holes 36a, 36b through which the light path extends.

The above-described photo-interrupter operates as follows. As shown in FIG. 5, when there is no detection subject, or object to be detected, in the groove 34, light generated by the light emitting element 10 goes through, in sequence, the inclined surface 37 and the transmission hale 36a and then transverses the groove 34. Further, the light goes through the transmission hole 36b, the inclined surface 38, and finally reaches the light receiving element 15. The light receiving element 15 thereby detects the light. On the other hand, when an object 33 exists in the groove 34 (See double-dotted line in the figure.), the light receiving element 15 does not detect light because the light is interrupted by the object. In this way, the photo-interrupter 1 discriminates whether an object exists or not.

Subsequently, explanation will be given about the method of manufacturing the surface mount type photo-interrupter 1.

Figure 9:
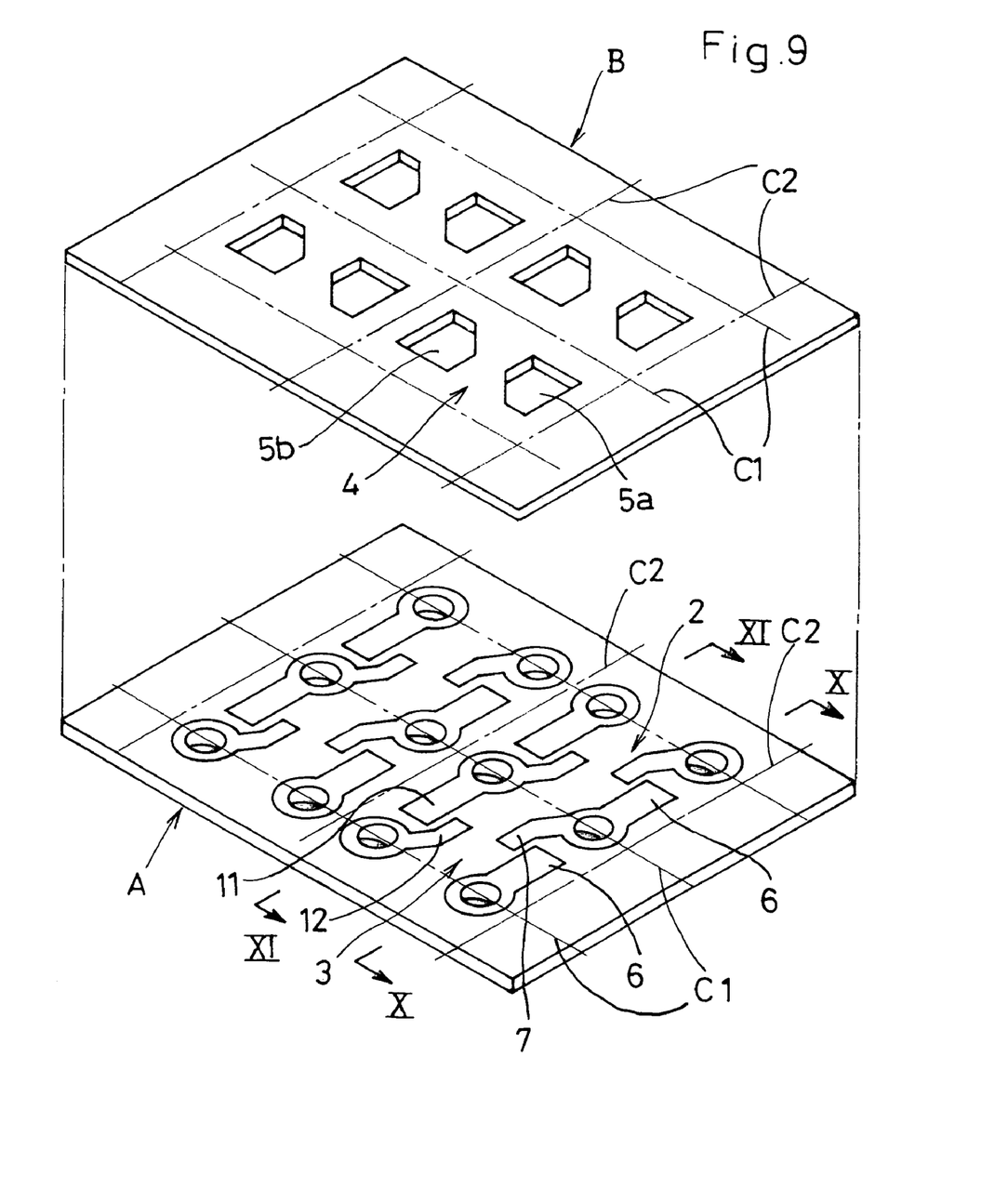
FIG. 9 is a perspective view showing a main material substrate and a sub material substrate to be utilized in manufacturing of the photo-interrupter.
Figure 10:
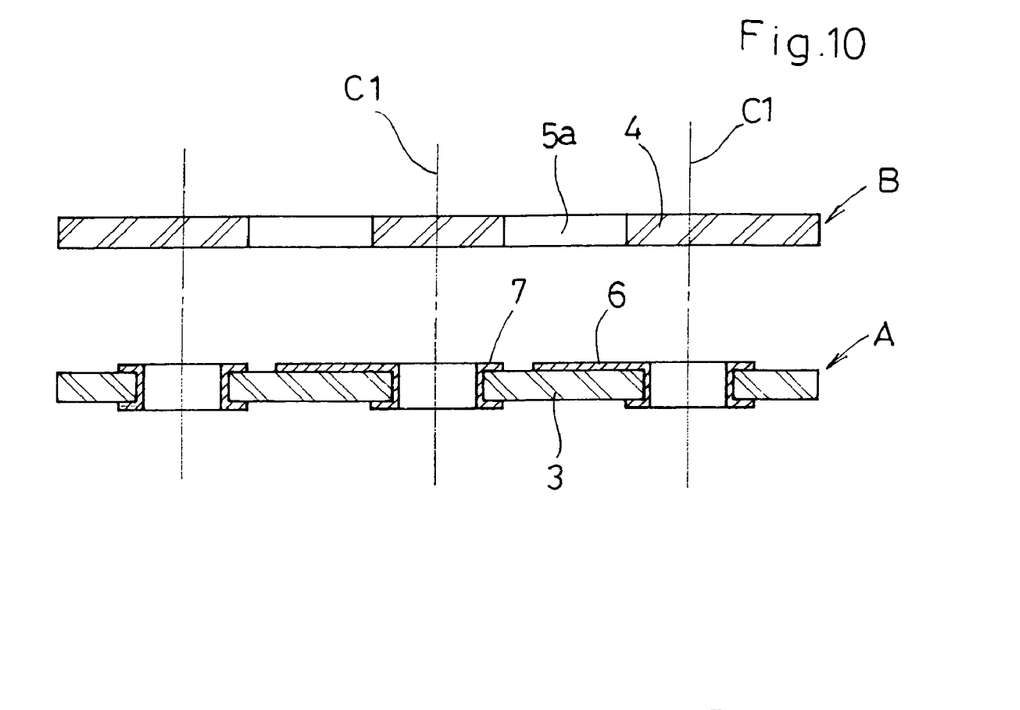
FIG. 10 is a sectional view along a line X-X in FIG. 9.
Figure 11:
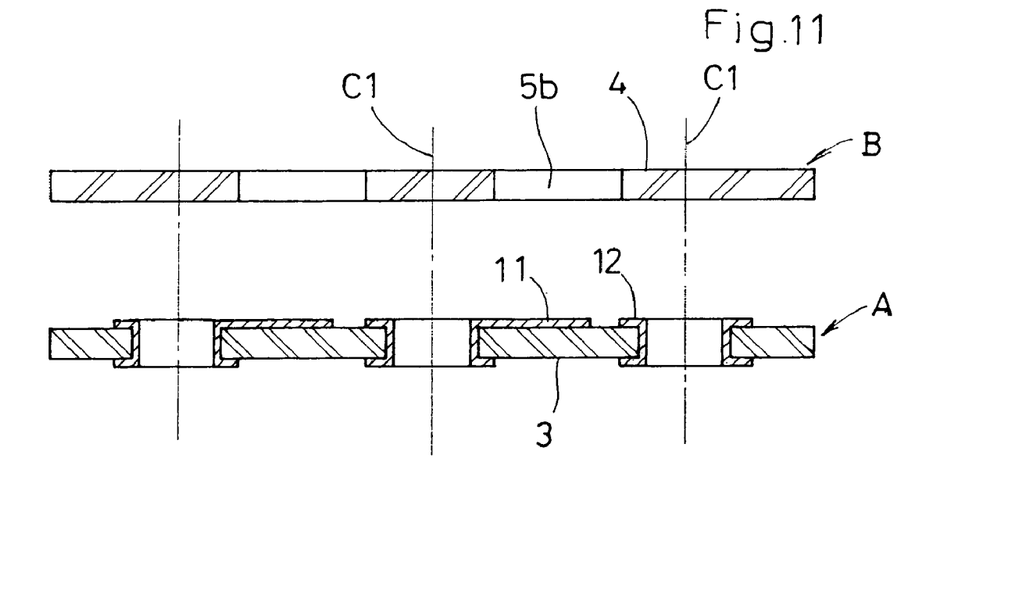
FIG. 11 is a sectional view along a line XI-XI in FIG. 9.

At the beginning, as shown in FIGS. 9-11, a main material substrate A is prepared by processing a glass epoxy board. The main material substrate A is formed with a plurality of through-holes to be made into recesses 18, 21, 24, 27. Metal films to be made into side electrodes 19, 22, 25, 28 are formed on the inner surfaces of the through-holes. Further, electrode patterns 6, 7, 11, 12 and terminal electrodes 20, 23, 26, 29 are formed on the main material substrate A.

Similarly, a sub material substrate B is prepared by processing a glass epoxy board. The sub material substrate B is formed with a plurality of through-holes 5a, 5b.

Figure 12:
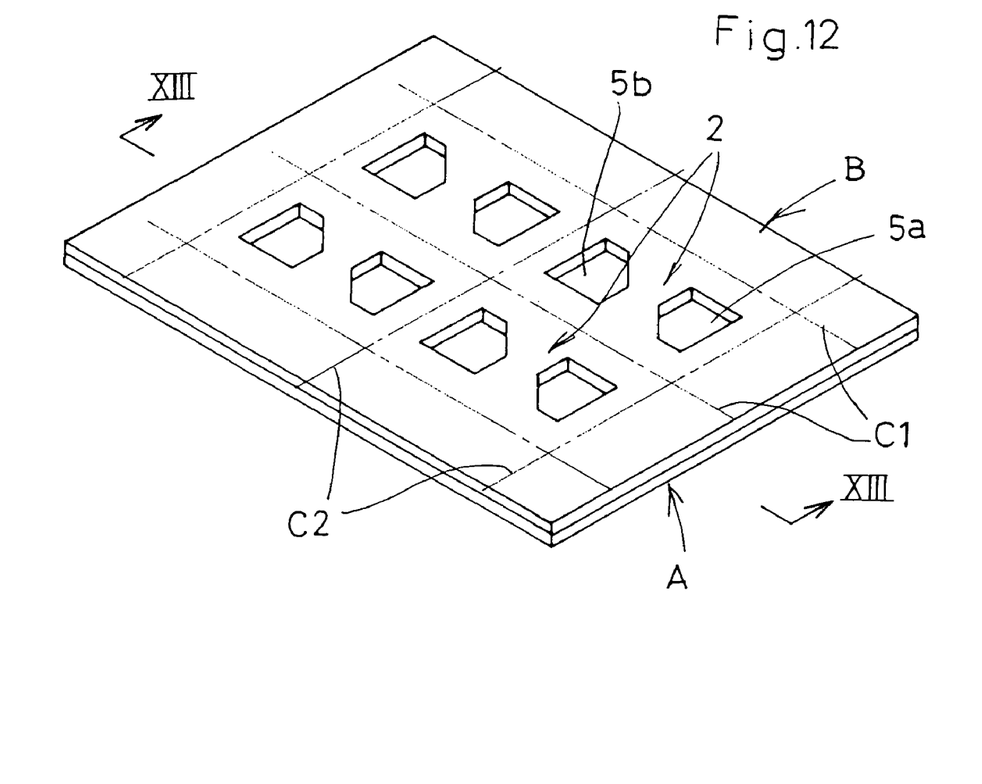
FIG. 12 is a perspective view showing the first step of a method of manufacturing the photo-interrupter.
Figure 13:
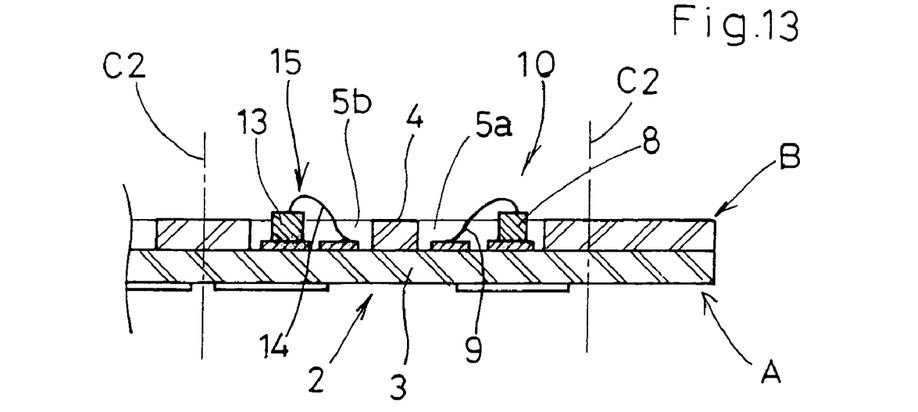
FIG. 13 is a sectional view along a line XIII-XIII in FIG. 12.

Then, as shown in FIG. 12, the sub material substrate B is laid and fixed onto the main material substrate A. Next, as shown in FIG. 13, a light emitting diode chip 8 and a light sensitive chip 13 are put in the through-hole 5a, 5b and fixed through die bonding. Wire bonding is then performed using metal wires 9, 14. In this way, a light emitting element 10 and a light receiving element 15 are provided.

In the case that die bonding and wire bonding are performed after fixation of the main material substrate A and the sub material substrate B, the two stacked substrates exhibit a large rigidity as a whole. In the present case, the light emitting element 10 and the light receiving element 15 are formed advantageously on the condition that deformation of the two substrates is suppressed small. Die bonding and wire bonding, however, may be performed before fixation of the main material substrate A and the sub material substrate B.

Figure 14:
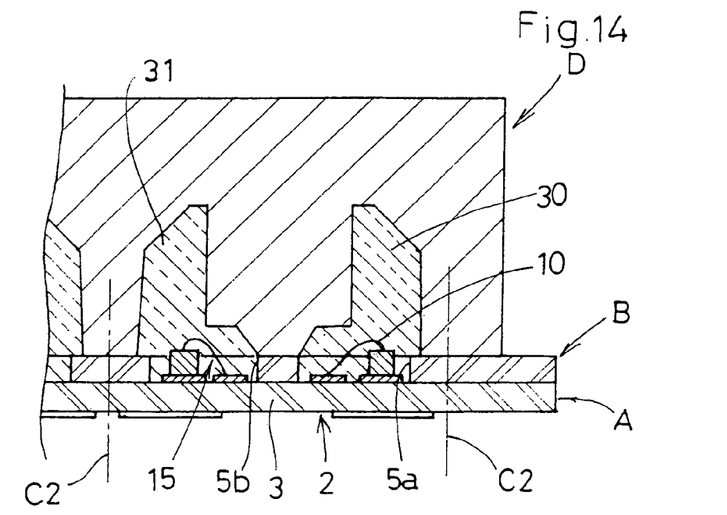
FIG. 14 is a sectional view showing the second step of the method.
Figure 15:
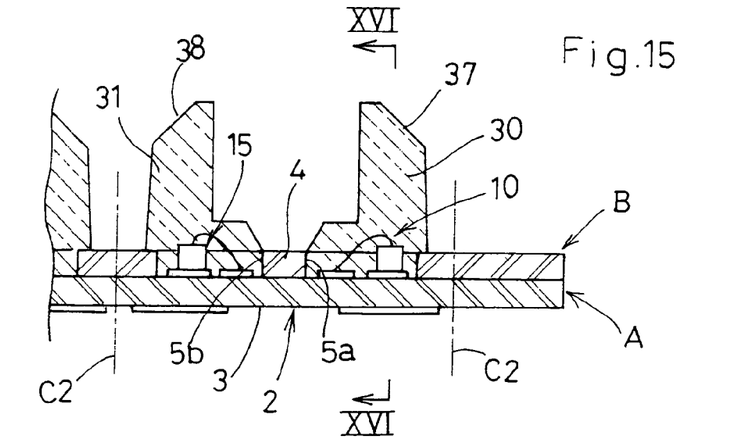
FIG. 15 is a sectional view showing the third step of the method.
Figure 16:
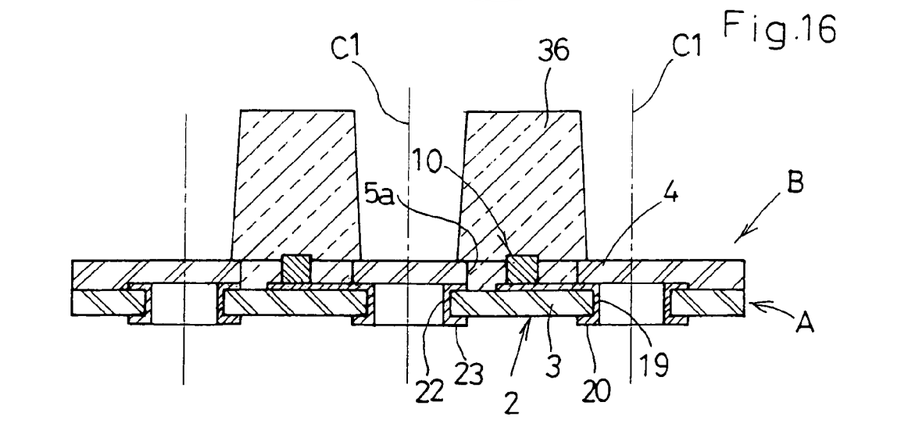
FIG. 16 is a sectional view along a line XVI-XVI in FIG. 15.

Subsequently, as shown in FIG. 14, transfer molding is performed through pressing a die D for forming primary molds onto the sub material substrate B. In this way, as shown in FIG. 15 and FIG. 16, primary molds 30, 31 are formed with inclined surfaces 37, 38. As a substitute for the die D, two individual dies may be utilized for forming respective primary molds 30 and 31.

Figure 17:
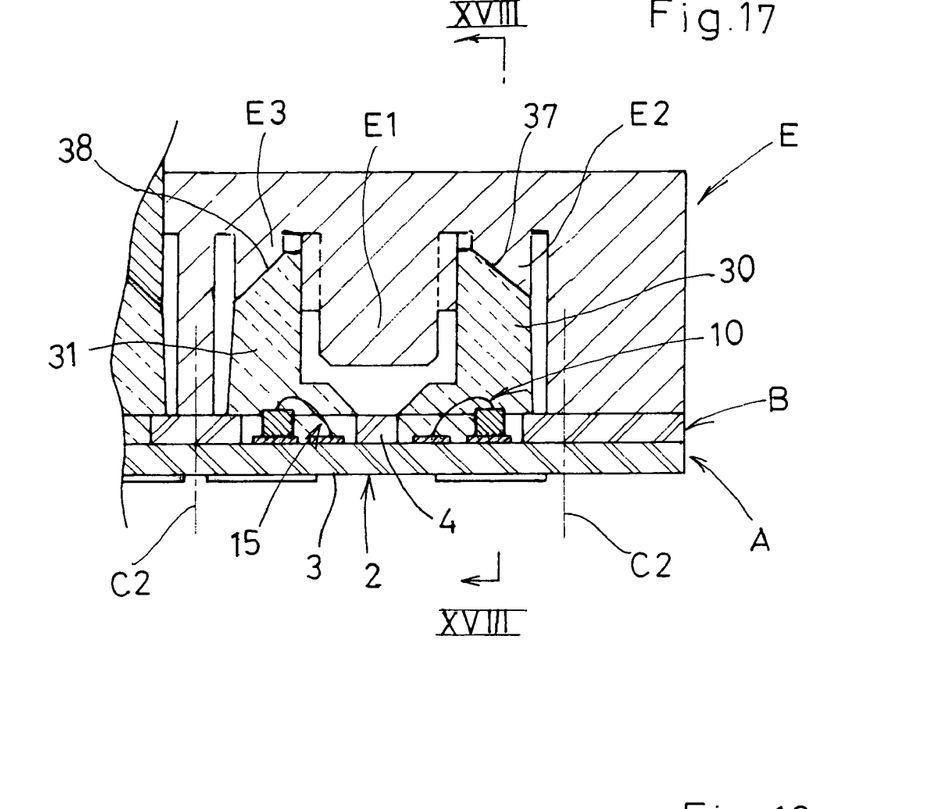
FIG. 17 is a sectional view showing the fourth step of the method.
Figure 18:
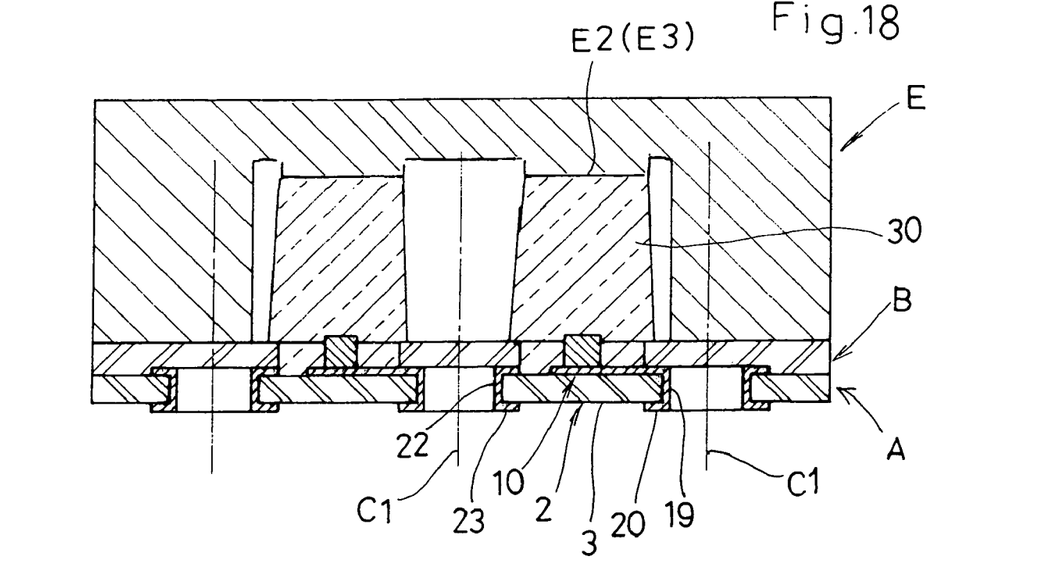
FIG. 18 is a sectional view along a line XVIII-XVIII in FIG. 17.
Figure 19:
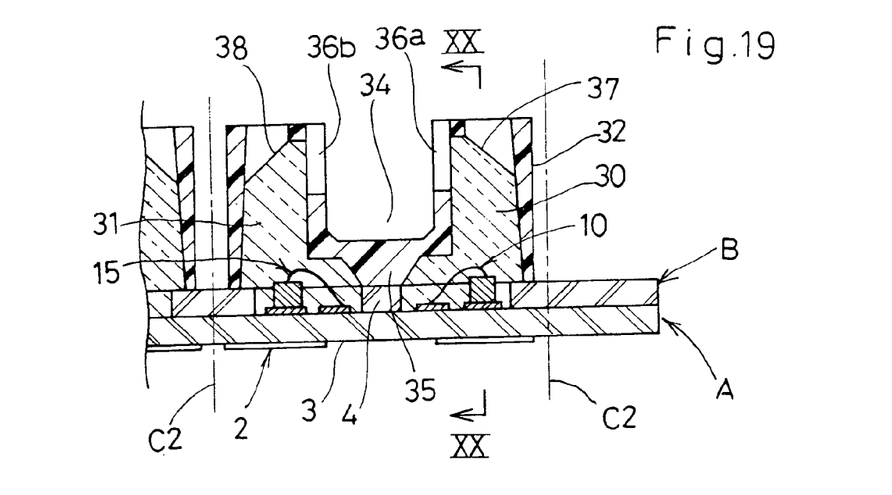
FIG. 19 is a sectional view showing the fifth step of the method.
Figure 20:
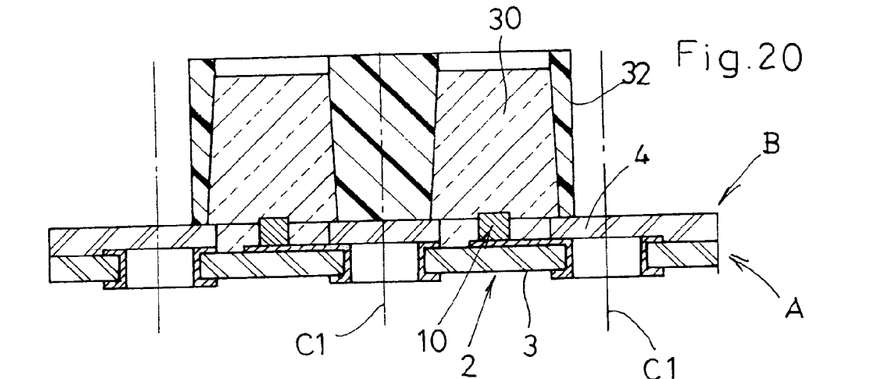
FIG. 20 is a sectional view along a line XX-XX in FIG. 19.

Subsequently, as shown in FIG. 17 and FIG. 18, transfer molding is performed by pressing a die E for forming a secondary mold onto the sub material substrate B. In this way, as shown in FIG. 19 and FIG. 20, a secondary mold 32 fixing integrally the two primary molds 30, 31 are formed with a groove 34, a pair of transmission holes 36a, 36b, and a light shielding portion 35, as described above.

As shown in FIG. 17, the portion E1, i.e. a core, of the die E serves to form the groove 34. The portions E2 and E3 serve to make contact with the inclined surfaces 37, 38 so as to press the primary molds 30, 31, respectively, toward the sub material substrate B. Such downward press also causes both of the primary molds 30, 31 to be pressed laterally toward the portion E1 located in the center of the figure. Thereby, part of the portion E1 (for forming the transmission holes 36a, 36b) closely contact with the primary molds 30, 31. In this situation, opaque synthetic resin to form the secondary mold 32 is prevented from enter gaps between the above-mentioned part of the portion E1 and the primary mold 30, 31. The transmission holes 36a, 36b are thus obtained without a burr of opaque synthetic resin.

Figure 21:
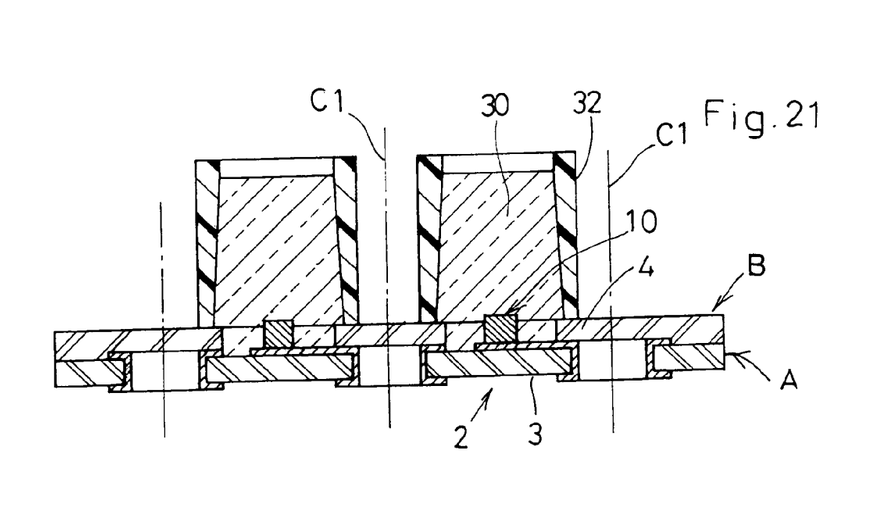
FIG. 21 is a sectional view showing the sixth step of the method.
Figure 22:
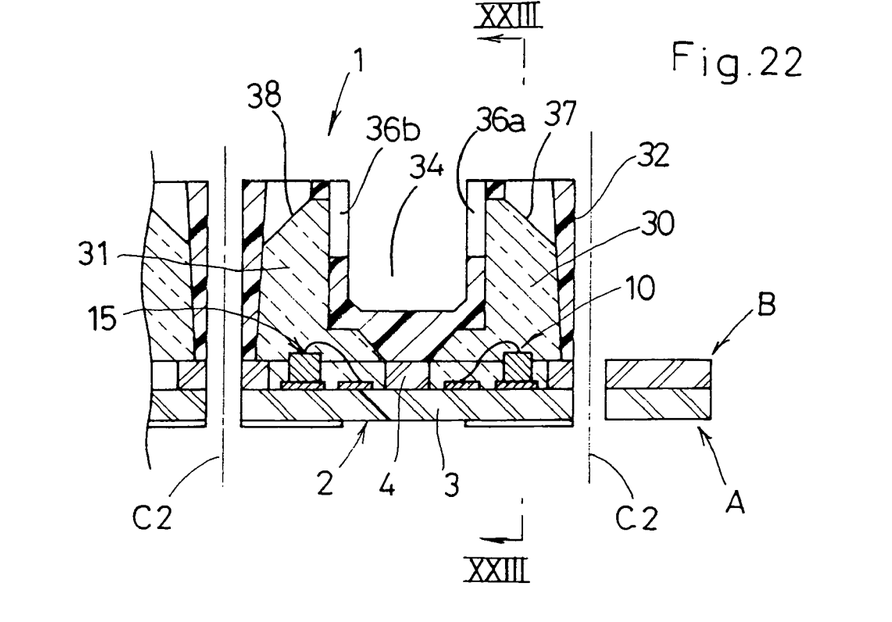
FIG. 22 is a sectional view showing the seventh step of the method.
Figure 23:
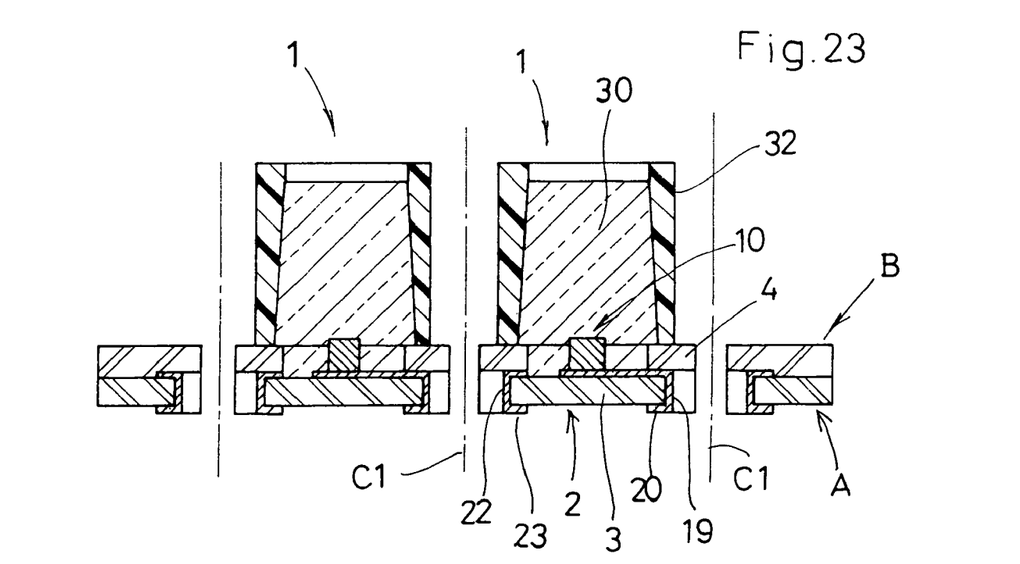
FIG. 23 is a sectional view along a line XXIII-XXIII in FIG. 22.

Next, as shown in FIG. 21, the secondary mold 32 is cut through dicing process along the cutting line C1. As shown in FIG. 22, dicing process is then performed along the cutting line C2 so as to cut the secondary mold 32 and the insulating base 2. Finally, as shown in FIG. 23, dicing process is performed to cut the insulating base 2 along the cutting line C1. In this way, discrete photo-interrupters 1 of surface mount type are obtained.

Figure 24:
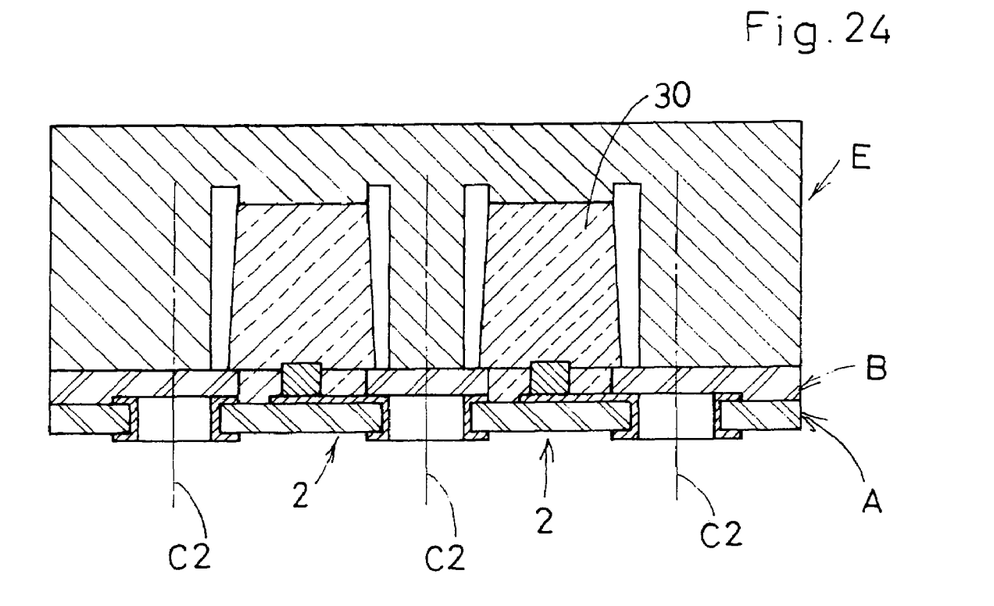
FIG. 24 is a sectional view showing a variation of the first step.
Figure 25:
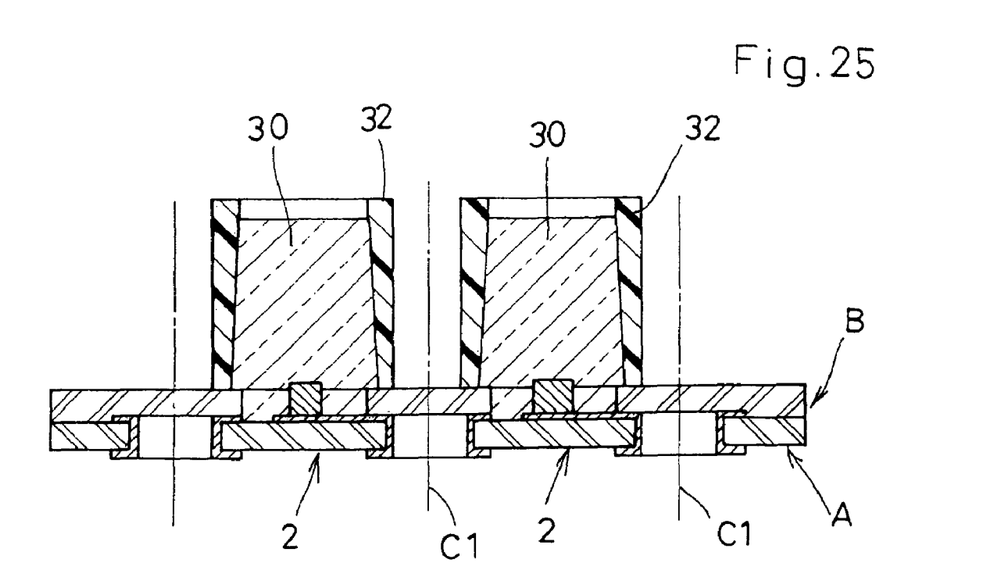
FIG. 25 is a sectional view showing a variation of the second step.

The present invention does not limit methods of manufacturing a surface mount type photo-interrupter to the above-described cases. The die E, for example, may take the shape which eliminates the need for cutting the secondary mold 31 through dicing process as shown in FIG. 24 and FIG. 25.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A surface mount type photo-interrupter comprising:
   an insulating base provided with an upper surface, a lower surface opposite to the upper surface, and a side surface connecting the upper surface and the lower surface;
   a light emitting element provided at the upper surface of the insulating base;
   a light receiving element provided at the upper surface of the insulating base;
   a first terminal electrode for the light emitting element;
   a second terminal electrode for the light receiving element;
   a first primary mold made of transparent synthetic resin and covering the light emitting element;
   a second primary mold made of transparent synthetic resin and covering the light receiving element;

a secondary mold made of opaque synthetic resin and fixing the first primary mold and the second primary mold;

wherein each of the first and second terminal electrodes is formed on at least one of the side surface and the lower surface of the insulating base, wherein the secondary mold is provided with a groove which light generated by the light emitting element inverses to reach the light receiving element, the groove being located between the first and the second primary molds, and wherein the secondary mold is provided with a pair of inner surfaces facing the groove, each of the inner surfaces being provided with a transmission hole for light, the first primary mold being provided with a first reflecting surface to direct light from the light emitting element toward the transmission holes, the second primary mold being provided with a second reflecting surface to direct light from the transparent holes toward the light receiving element.

2. The surface mount type photo-interrupter according to claim 1, wherein the secondary mold includes a light shielding pardon located between the first primary mold and the second primary mold.

3. The surface mount type photo-interrupter according to claim 1, wherein the insulating base includes a plurality of insulating substrates which are stacked.

4. A method of manufacturing a surface mount type photo-interrupter, the method comprising:
   a step of providing an upper surface of an insulating base with a light emitting element and a light receiving element;
   a step of forming a first terminal electrode for the light emitting element and a second terminal electrode for the light receiving element on at least one of a side surface and a lower surface of the insulating base;
   a first primary mold forming step of pressing primary mold forming die onto the upper surface of the insulating base so as to form a first primary mold made of transparent synthetic resin and covering the light emitting element;
   a second primary mold forming step of pressing a primary mold forming die onto the upper surface of the insulating base so as to form a second primary mold made of transparent synthetic resin and covering the light receiving element; and
   a secondary mold forming step of pressing a secondary mold forming die onto the upper surface of the insulating base so as to form a secondary mold made of opaque synthetic resin and fixing the first and the second primary molds integrally;
   wherein, in the secondary mold forming step, the secondary mold is formed with a groove located between the first primary mold and the second primary mold, the groove allowing a detection subject to pass through and being traversed by light propagating from the light emitting element to the light receiving element the secondary mold being also formed with transmission holes through which the light propagates,
   wherein the groove and the transmission holes in the secondary mold are formed by a core, and
   wherein when the secondary mold forming die is pressed onto the insulating base, the secondary mold forming die makes contact with an inclined reflection surface provided at the first primary mold and another inclined reflection surface provided at the second primary mold so as to press both of the first and the second primary molds onto the core.

5. The method according to claim 4, wherein the first and the second primary molds are formed simultaneously with a single die.

6. A method of manufacturing a surface mount type photo-interrupter, the method comprising:
   a step of producing a material substrate including a plurality of regions corresponding to a plurality of insulating substrates;
   a step of providing an upper surface of the material substrate with light emitting elements and light receiving elements corresponding to the respective regions;
   a step of forming, on the material substrate, first terminal electrodes corresponding to the respective light emitting elements at the respective regions and second terminal electrodes corresponding to the respective light receiving elements at the respective regions;
   a first primary mold forming step of pressing a primary mold forming die onto the upper surface of the material substrate so as to form first primary molds made of transparent synthetic resin and covering the respective light emitting elements at the respective regions;
   a second primary mold forming step of pressing a primary mold forming die onto the upper surface of the material substrate so as to form second primary molds made of transparent synthetic resin and covering the respective light receiving elements at the respective regions;
   a secondary mold forming step of pressing a secondary mold forming die onto the upper surface of the material substrate so as to form secondary molds made of opaque synthetic resin and covering the first and the second primary molds integrally at the respective regions; and
   a step of cutting the material substrate to isolate the respective regions individually;
   wherein, in the secondary mold forming step, a core integral with the secondary mold forming die is used to form a groove and light transmission holes in each of the secondary molds, the groove being located between the first primary mold and the second primary mold, the groove allowing a detection subject to pass through and being traversed by light propagating from the light emitting element to the light receiving element, and
   wherein when the secondary mold forming die is pressed onto the material substrate, the secondary mold forming die makes contact with inclined reflection surfaces of the first and the second primary molds in each of the regions so as to press both of the first and second primary molds onto the core.

7. The method according to claim 6, wherein the first and second primary molds are formed simultaneously with a single die.

* * * * *